United States Patent [19]

Miles

[11] Patent Number: 5,721,450

[45] Date of Patent: Feb. 24, 1998

[54] MOISTURE RELIEF FOR CHIP CARRIERS

[75] Inventor: Barry M. Miles, Plantation, Fla.

[73] Assignee: Motorola, Inc.

[21] Appl. No.: 489,573

[22] Filed: Jun. 12, 1995

[51] Int. Cl.[6] .................... H01L 23/495; H01L 23/02; H01L 23/48

[52] U.S. Cl. .................... 257/667; 257/676; 257/680; 257/690

[58] Field of Search .................. 257/690, 684, 257/700, 676, 688, 738, 782, 783, 786, 787, 667, 680, 790

[56] References Cited

U.S. PATENT DOCUMENTS

| | | | |
|---|---|---|---|
| 4,760,440 | 7/1988 | Bigler et al. | 257/680 |
| 4,866,506 | 9/1989 | Namba et al. | 257/787 |
| 4,910,581 | 3/1990 | Baird | 257/675 |
| 4,942,452 | 7/1990 | Kitano et al. | 357/68 |
| 5,296,738 | 3/1994 | Freyman et al. | 257/684 |

FOREIGN PATENT DOCUMENTS 1-170027 of 0000 Japan.

*Primary Examiner*—Valencia Martin Wallace
*Attorney, Agent, or Firm*—Glenn E. Gold; Dale W. Dorinski

[57] ABSTRACT

An integrated circuit package (10) comprises a semiconductor die (14) having a top surface and a bottom surface, and a substrate (16) for receiving the semiconductor die. The substrate should have an aperture(s) (18) below the semiconductor die for providing moisture relief during temperature excursions. An adhesive (20) applied to the substrate allows for mounting the semiconductor die to the substrate. Then, the semiconductor die is wirebonded to the substrate. Finally, an encapsulant (12) for sealing the top surface of the semiconductor die is formed over the semiconductor die and portions of the substrate.

20 Claims, 4 Drawing Sheets

50

5,721,450

MOISTURE RELIEF FOR CHIP CARRIERS

TECHNICAL FIELD

This invention relates to printed circuit board chip carriers, and more particularly to overmolded and glob top chip carriers that allow for moisture relief.

BACKGROUND OF THE INVENTION

Plastic Ball Grid Array (PBGA) chip carriers, such as the Over Molded Pad Array Carrier (OMPAC™), the Over Molded Peripheral Chip Carrier (OMPCC), and the Over Molded Pin Grid Array (OMPGA) and their equivalent glob top printed circuit board chip carriers are susceptible to moisture absorption. These integrated circuit packages suffer from a well-known phenomena known as "Popcorning" when subjected to heat. This problem is particularly noticeable in surface mount packages using printed circuit board (PCB) substrates, which experience thermal and mechanical stresses due to the exposure of the entire package to solder reflow temperatures. Typically, these integrated circuit packages are baked prior to solder assembly to remove moisture. Moisture usually penetrates into and through the molded plastic resin encapsulant, the PCB substrate, and especially the adhesive used to attach the die to the substrate. The die attach adhesive is usually a hygroscopic material. When the package is exposed to solder reflow temperatures after the die attach adhesive has absorbed moisture, the moisture is rapidly converted into a gas, expanding dramatically. This causes the die to delaminate from the substrate, creating the "popcorn" effect.

U.S. Pat. No. 4,866,506 by Nambu et. al. discusses a flat plastic-sealed lead frame package that has an opening on an underside of the package, allowing the die flag to be exposed to the atmosphere, thereby venting or releasing of moisture when subjected to heat. This package, also known as the Quad Flat Pack (QFP), is easily manufactured, but leaves the bottom surface of the lead frame exposed to the atmosphere. The QFP does not use a substrate or printed circuit board as in OMPAC, OMPCC, and OMPGA and their glob top equivalents; thus, a different solution is required.

U.S. Pat. No. 5,296,738 by Freyman et. al. discusses a printed circuit board chip carrier with an opening(s) in the PCB substrate, located directly beneath the semiconductor die, which provides the means for moisture relief when the package is subjected to extreme temperature excursions (i.e., board reflow profiles). In this package, the opening is initially covered on the back side of the printed circuit board substrate with solder resist. The covered opening prevents the flow of die attach material from the top side surface through the opening and onto the backside solder pads; however, the opening(s) are partially or completely filled with die attach material. After final assembly of the package, the solder resist must be pierced or punctured to create the final opening for moisture relief.

DESCRIPTION OF THE PREFERRED EMBODIMENT

An integrated circuit package comprises a semiconductor die having a top surface and a bottom surface, and a substrate for receiving the semiconductor die. An adhesive applied to the substrate allows for mounting the semiconductor die to the substrate. The substrate should have an aperture(s) below the semiconductor die which must remain free of any obstruction such as the adhesive. Then, an over molded encapsulant or glob top for sealing the top surface of the semiconductor die is formed over the semiconductor die and portions of the substrate.

Figure 1:
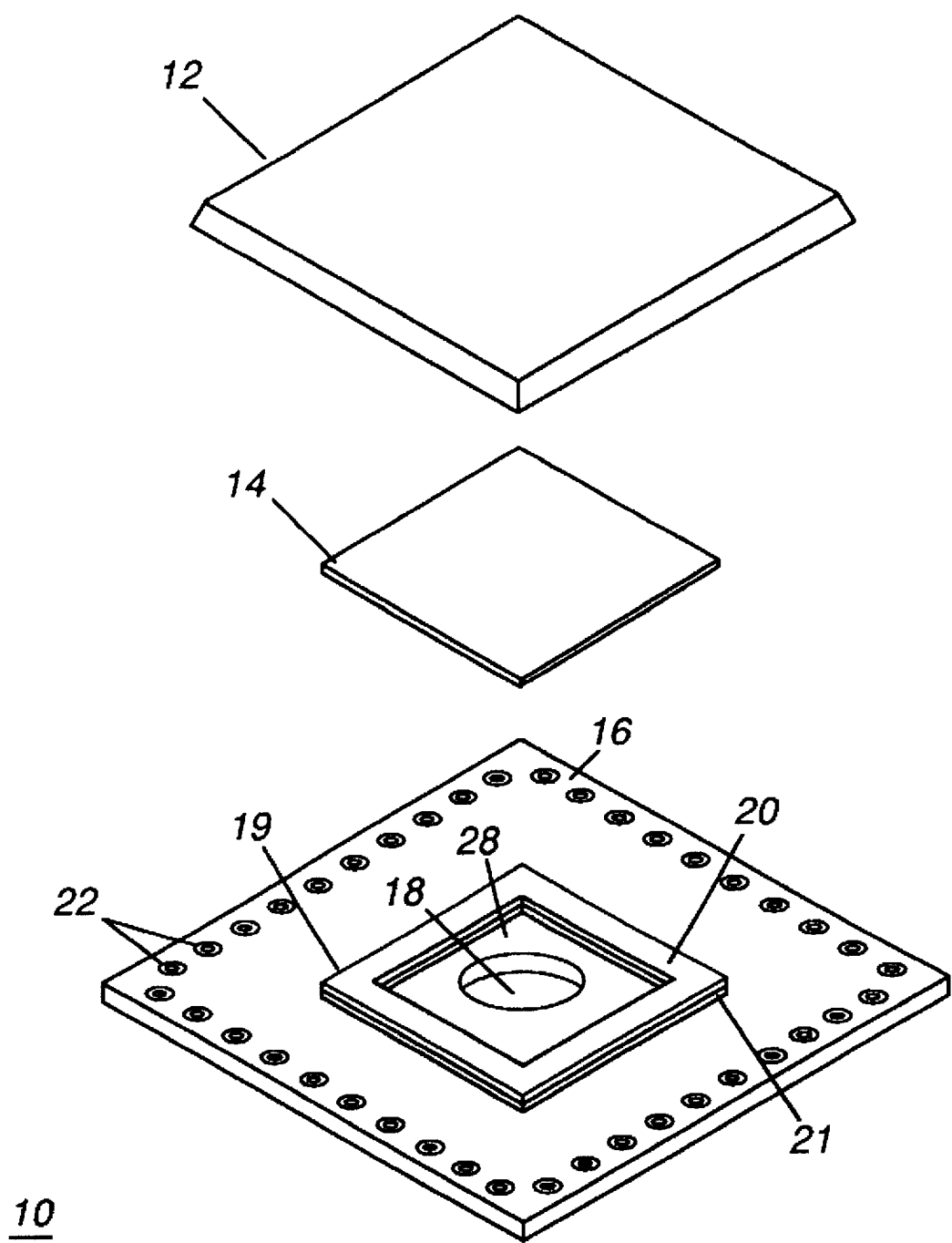
FIG. 1 is an exploded perspective view of an overmolded chip carrier in accordance with the present invention.

Referring to FIG. 1, there is shown a leadless chip carrier 10 in accordance with the present invention. Although shown as an overmolded leadless chip carrier, the chip carrier may take the form of an overmolded pad array carrier, an overmolded pin grid array, an overmolded peripheral chip carrier, or alternatively, a glob top pad array carrier, a glob top pin grid array, or a glob top peripheral chip carrier. Examples of overmolded and glob top carriers, also known as BGA or PBGA carriers, are found in the following U.S. Patent Nos. incorporated by reference, U.S. Pat Nos. 5,241,133, 4,688,152, 5,239,198, and 5,296,738. Essentially, the present invention is applicable to any printed circuit substrate chip carrier having integrated circuits and an encapsulant such as an over mold or glob top. Typically, a PCB 16 for receiving a semiconductor die 14 has printed circuitry 22 on the top side of the PCB. A die mounting area 19 is also on the top side, situated generally in the center of the PCB. A hole(s) or aperture(s) 18 is situated in the die mounting area 19 and constructed so as to reside below the semiconductor die 14. The hole 18 is preferably small enough not to alter the design of the solder connections on the bottom of the package, and extends completely through the PCB to form a via. In the preferred embodiment, a metal die flag 21 in the shape of a 'window frame' pattern is located in the die mounting area 19, so that the edges of the semiconductor die will fall upon the die flag. A die attach adhesive 20, such as a bisphenol-epichlorohydrin based epoxy which is preferably filled with silver, is applied in the die mounting area. The adhesive is preferentially applied with a dispenser, although other means of applying the adhesive is within contemplation of the present invention. When the die attach material is deposited on the metal 'window frame' die flag, the adhesive preferentially wets to the metal flag to create a 'window frame' of adhesive. The die attach material is 'captured' along the metal die flag by surface tension, with very little bleed out into the region centered under the semiconductor die. This prevents the adhesive from migrating towards the opening(s) 18 in the substrate.

Another version of the metal die flag pattern is a solid die flag. The entire region under the semiconductor die is a solid metal flag, with a solder resist dam defined on top of the metal flag to block the flow of the die attach material from the area where the opening(s) are located. Solder resists are so well known in the art that those skilled in the art will readily understand how to provide a solder resist pattern without further instruction. The solder resist can be defined in the familiar window frame pattern near the edge of the metal flag, leaving the central area open, or any variation in between. In all cases, the vent hole(s) must remain open and uncovered to allow for free movement of the entrapped moisture during the temperature excursion of the soldering operations. The die attach material is then applied on the metal flag outside the perimeter of the resist. The IC 14 is then placed in the die attach material 20 and cured by any number of conventional methods. The flag design and preferential application of die attach material result in no material entering the opening(s). After wire bonding, a transfer molded encapsulant 12 is applied over the die and portions of the substrate 16 forming the PBGA chip carrier 10 shown in FIG. 1.

It has been found that moisture venting is enhanced by the void 28 created under the semiconductor die during this process. This void 28 is even larger than the hole(s) 18, and by preventing any die attach material from filling the hole(s), accumulated moisture can be quickly vented. This is accomplished by applying or dispensing the die attach material only along the periphery of the semiconductor die. The flow of the die attach material during the initial stages of the curing process is restrained either by the metal die flag pattern or by a solder resist dam. Since, the application and flow of die attach material are controlled and kept away from the opening(s), this invention also eliminates the need for covering the hole with solder resist and any subsequent post-assembly processes to open the hole.

Figure 2:
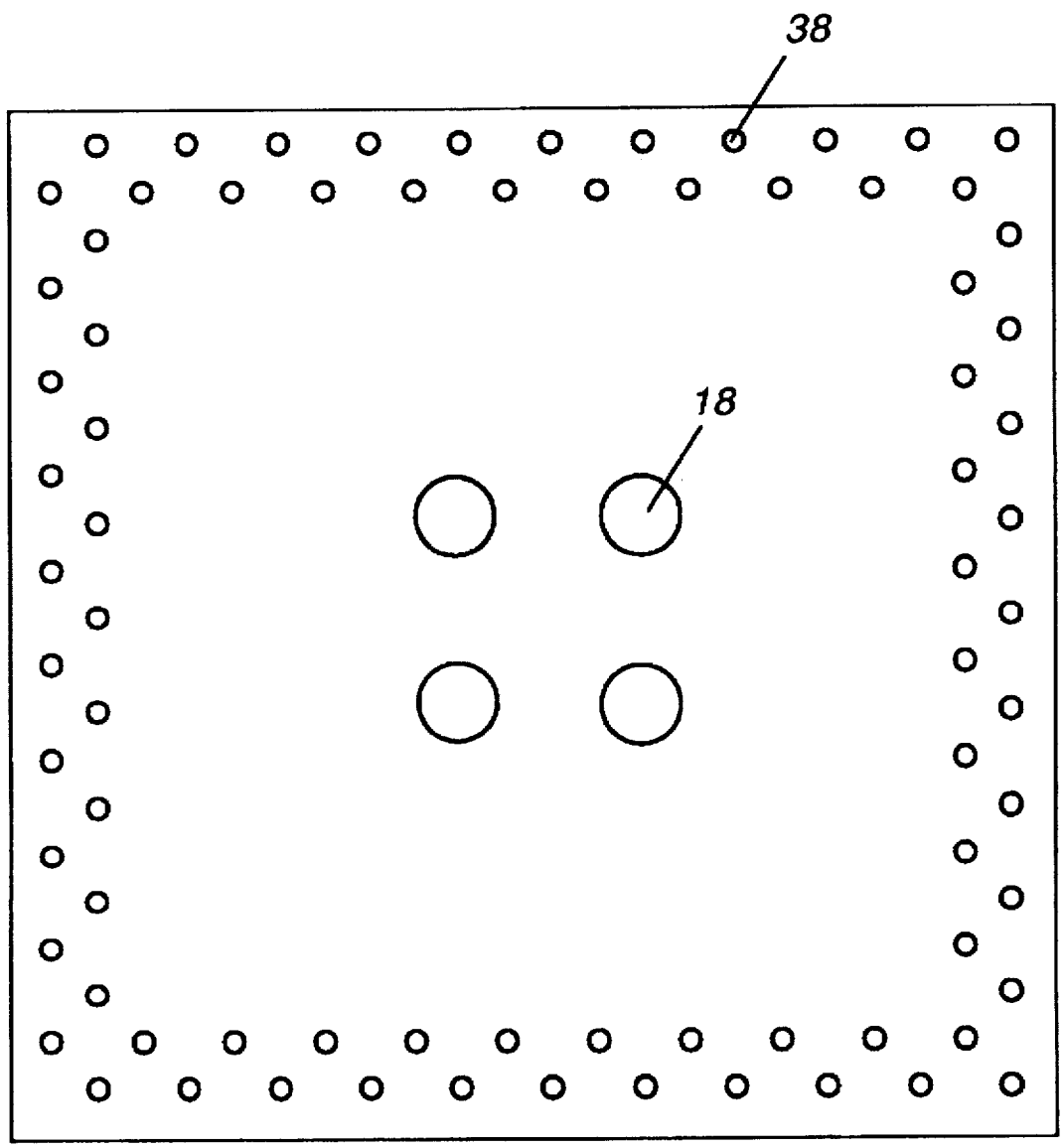
FIG. 2 is plan view of the bottom side of a perimeter chip carrier in accordance with the invention

The incorporation of a larger void area or opening(s) is especially advantageous for the new, higher I/O (>200) perimeter PBGA packages. As shown in FIG. 2, the surface mount solder pads 38 on the back side of the printed circuit board substrate are located in array format, but only in 3 to 4 rows around the perimeter of the package, leaving the center of the package free of solder interconnection sites. Therefore, a single, large opening or a number of smaller opening(s) 18 can be placed in this area.

Figure 3:
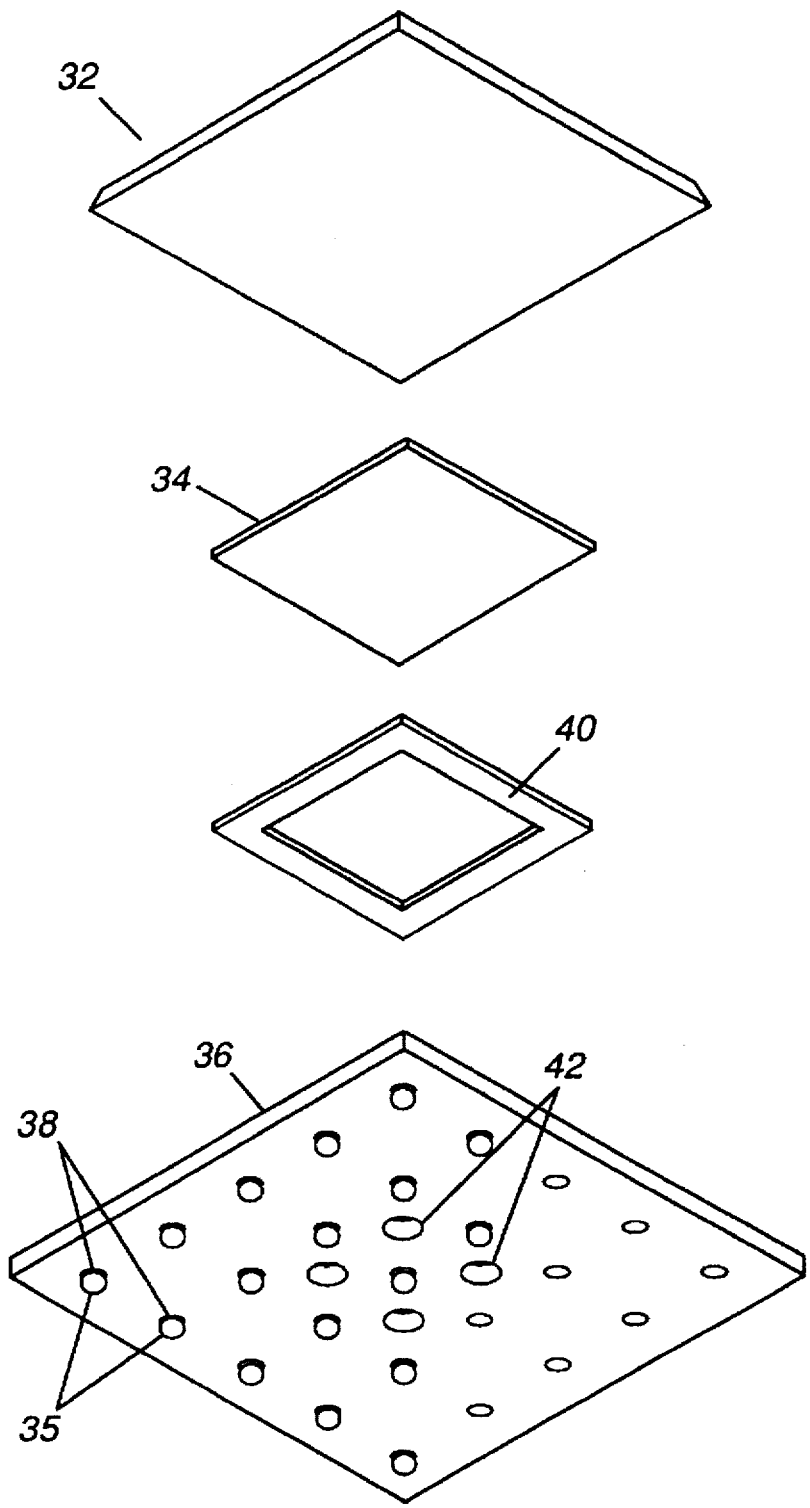
FIG. 3 is an exploded view showing the bottom surfaces of a overmolded pad array carrier in accordance with the present invention.

Referring now to FIG. 3, there is shown another overmolded chip carrier 30 in accordance with the present invention. This version of a PBGA carrier 30 includes an array of solder pads 38 on the bottom portion of a substrate 36. The PBGA carrier may be furnished with bare solder pads 38 or the solder pads may optionally have solder balls or bumps 35. In FIG. 3, some of the solder pads 38 are shown as having solder bumps 35. A hole(s) or aperture(s) 42 is arranged and constructed so as to reside below the semiconductor die 34. The hole 42 is preferably small enough not to alter the design of a solder bumped pad array on the bottom of a package as shown. The die attach adhesive 40 is applied in a pattern either to the bottom of the die 34 or the top surface of the substrate 36. The preferential application of the die attach pattern results in no material entering the openings 42. Then an encapsulating compound 32, such as a glob top or transfer molded resin, is formed over the die and portions of the substrate 36.

Figure 4:
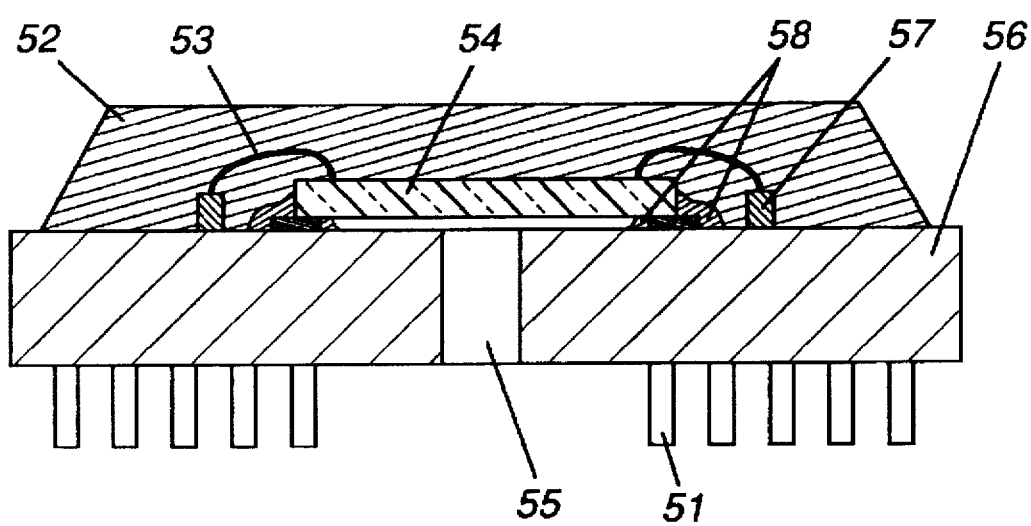
FIG. 4 is a cut view of overmolded pin grid array chip carrier in accordance with the present invention.

Referring now to FIG. 4, there is shown a cut view of a pin grid array version of a PBGA, (OMPGA) 50. The OMPGA is formed essentially as described above in FIG. 3, with the addition of pins 51 protruding from the bottom of the package. The OMPGA 50 comprises a substrate 56 having at least one aperture 55 residing below a semiconductor die 54. The back plane of the die 54 is attached to the substrate 56 via an adhesive 58. Some of the conductive runners 57 on the substrate 56 are coupled to the die 54 via a wirebond 53. Once the die is wirebonded, then an encapsulant 52 is formed above the substrate and around the die.

In summary, the present invention provides for a novel means of moisture relief for plastic encapsulated chip carriers made from printed circuit substrates. By providing a vent hole under the semiconductor die that is free of any obstruction such as die attach material or solder resist, any moisture that has accumulated within the package can be easily vented to the atmosphere. In contrast to the prior art, the instant invention does not have to be modified during assembly, since there is no solder resist or adhesive covering the hole that must first be pierced, thereby providing a package that is more amenable to automated assembly.

We claim as our invention:

1. A leadless chip carrier package, comprising:
   a printed circuit substrate having a die mounting area on a first side and having one or more vent openings located in the die mounting area, the vent openings extending through the substrate from the first side to a second opposing side, and the second side having a plurality of surface mount solder pads;
   a die attach adhesive disposed in the die mounting area so that the vent openings remain completely free of adhesive;
   a semiconductor die disposed in the die mounting area and covering the vent openings, the die bonded to the substrate by means of the die attach adhesive, and the vent openings remaining open and uncovered such that areas of the die positioned above the vent openings remain exposed to the atmosphere;
   at least one wirebond electrically connecting the semiconductor die to the printed circuit substrate; and
   a plastic resin encapsulating the semiconductor die, the at least one wirebond, and portions of the printed circuit substrate first side.

2. The leadless chip carrier package of claim 1, wherein a perimeter portion of the substrate first side is not covered with the plastic resin.

3. The leadless chip carrier package of claim 1, wherein the plastic resin comprises a glob top encapsulant or a transfer molded encapsulant.

4. The leadless chip carrier package of claim 3, wherein the plurality of surface mount solder pads comprises a pad grid array.

5. The leadless chip carrier package of claim 3, wherein the plurality of surface mount solder pads comprises a peripheral array.

6. The leadless chip carrier package of claim 3, further comprising solder balls attached to the plurality of surface mount solder pads.

7. The leadless chip carrier package of claim 1, wherein said adhesive comprises a bisphenol-epichlorohydrin based epoxy.

8. The leadless chip carrier package of claim 1, wherein the vent opening is less than 30 mils in diameter.

9. The leadless chip carrier package of claim 1, further comprising a metal die flag bonded to the printed circuit substrate in the die mounting area, a central portion of the metal die flag having one or more openings situated so that the metal die flag does not cover the vent openings.

10. The leadless chip carrier package of claim 9, wherein the metal die flag is a window frame pattern.

11. The leadless chip carrier package of claim 9, wherein the metal die flag is a solid die flag.

12. A peripheral pad chip carrier package, comprising:
   a printed circuit substrate having a die mounting area on a first side and a vent opening located in the die mounting area, the vent opening extending through the substrate from the first side to a second opposing side, and the second side having a plurality of solder bumps arranged near a perimeter of the printed circuit substrate;
   a semiconductor die disposed in the die mounting area and covering the vent opening, the vent opening remaining open and uncovered such that an area of the die positioned above the vent opening remains exposed to the atmosphere;

a pattern of die attach adhesive deposited in the die mounting area, the pattern arranged in a manner sufficient to adhesively bond the die to the substrate and to keep the die attach adhesive away from the vent opening;

wirebonds electrically connecting the semiconductor die to the printed circuit substrate; and a transfer molded plastic resin encapsulating the semiconductor die, the at least one wirebond, and portions of the printed circuit substrate first side.

13. The peripheral pad chip carrier package of claim 12, wherein the vent opening comprises a plurality of through holes.

14. The peripheral pad chip carrier package of claim 12, further comprising a metal die flag bonded to the printed circuit substrate in the die mounting area, a central portion of the metal die flag having one or more openings situated so that the metal die flag does not cover the vent openings.

15. The peripheral pad chip carrier package of claim 14, wherein the metal die flag is a window frame pattern.

16. The peripheral pad chip carrier package of claim 14, wherein the metal die flag is a solid die flag.

17. A leaded chip carrier package, comprising:

a printed circuit substrate having a die mounting area on a first side and having one or more vent openings located in the die mounting area, the vent openings extending through the substrate from the first side to a second opposing side, and the second side having a plurality of pins extending therefrom;

a die attach adhesive disposed in the die mounting area so that the vent openings remain completely free of adhesive;

a semiconductor die disposed in the die mounting area and covering the vent openings, the die bonded to the substrate by means of the die attach adhesive, and the vent openings remaining open and uncovered such that areas of the die positioned above the vent openings remain exposed to the atmosphere;

at least one wirebond electrically connecting the semiconductor die to the printed circuit substrate; and a plastic resin encapsulating the semiconductor die, the at least one wirebond, and portions of the printed circuit substrate first side.

18. The leaded chip carrier package of claim 17, further comprising a metal die flag bonded to the printed circuit substrate in the die mounting area, a central portion of the metal die flag having one or more openings situated so that the metal die flag does not cover the vent openings.

19. The leaded chip carrier package of claim 18, wherein the metal die flag is a window frame pattern.

20. The leaded chip carrier package of claim 18, wherein the metal die flag is a solid die flag.

* * * * *